(12) United States Patent
Dinc et al.

(10) Patent No.: US 11,716,056 B2
(45) Date of Patent: Aug. 1, 2023

(54) POWER AMPLIFIER WITH SERIES TRANSFORMER COMBINERS AND HARMONIC TUNING

(71) Applicant: TEXAS INSTRUMENTS INCORPORATED, Dallas, TX (US)

(72) Inventors: Tolga Dinc, Dallas, TX (US); Sachin Kalia, Dallas, TX (US); Swaminathan Sankaran, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 175 days.

(21) Appl. No.: 17/109,763

(22) Filed: Dec. 2, 2020

(65) Prior Publication Data
US 2022/0173700 A1 Jun. 2, 2022

(51) Int. Cl.
*H03F 9/00* (2006.01)
*H03F 1/02* (2006.01)
*H03F 3/45* (2006.01)

(52) U.S. Cl.
CPC ........... *H03F 1/02* (2013.01); *H03F 3/45475* (2013.01); *H03F 2200/09* (2013.01); *H03F 2200/541* (2013.01)

(58) Field of Classification Search
CPC .................................... H03F 9/00; H03F 3/45
USPC ........................................ 330/165, 252, 276
See application file for complete search history.

(56) References Cited

U.S. PATENT DOCUMENTS

| 3,639,841 | A | * | 2/1972 | Richardson | ........ G01R 29/0857 343/703 |
| 4,829,570 | A | * | 5/1989 | Schotz | ...................... H04B 3/54 455/72 |
| 11,057,008 | B2 | * | 7/2021 | Shao | ....................... H03F 3/193 |
| 2005/0189995 | A1 | | 9/2005 | Kee et al. | |
| 2010/0019858 | A1 | * | 1/2010 | McMorrow | ......... H03F 3/45475 336/200 |
| 2010/0164628 | A1 | | 7/2010 | Pallotta | |
| 2010/0244962 | A1 | | 9/2010 | Jen et al. | |
| 2014/0073271 | A1 | * | 3/2014 | Ilkov | ...................... H03F 3/195 455/91 |

(Continued)

FOREIGN PATENT DOCUMENTS

WO 0231967 A2 4/2002

OTHER PUBLICATIONS

International Search Report for PCT/US2021/061321 dated Feb. 24, 2022; 2 pages.

(Continued)

*Primary Examiner* — Henry Choe
(74) *Attorney, Agent, or Firm* — Frank D. Cimino

(57) ABSTRACT

A system includes a first differential amplifier and a first transformer with a primary coil coupled to an output of the first differential amplifier and with a secondary coil coupled to a load. The system also includes a second differential amplifier and a second transformer with a primary coil coupled to an output of the second differential amplifier and with a secondary coil coupled in series with the secondary coil of the first transformer. The system also includes a tuning network coupled to a center tap node between the secondary coil of the first transformer and the secondary coil of the second transformer.

27 Claims, 11 Drawing Sheets

(56) References Cited

U.S. PATENT DOCUMENTS

2015/0194942 A1\* 7/2015 Anderson .............. B82Y 40/00
330/297
2019/0173439 A1\* 6/2019 Dunworth ............... H03F 1/565

OTHER PUBLICATIONS

Written Opinion of the International Searching Authority for PCT/US2021/061321 dated Feb. 24, 2022; 3 pages.

\* cited by examiner

POWER AMPLIFIER WITH SERIES TRANSFORMER COMBINERS AND HARMONIC TUNING

BACKGROUND

The proliferation of electronic devices and integrated circuit (IC) technology has resulted in the commercialization of IC products. As new electronic devices are developed and IC technology advances, new IC products are commercialized. One example IC product that is needed in electronic devices is a power amplifier, where an example power amplifier/converter uses a transformer to convert direct current (DC) power to alternating current (AC) power. To increase the amount of power to a load, some power amplifier topologies use multiple transformers, where the secondary windings of the transformers are combined in series or in parallel.

FIG. 1A is a schematic diagram showing a first power amplifier topology 100 with two transformers, X1 and X2. In the first power amplifier topology 100, X1 has a primary inductor (L1) and a secondary inductor (12) with a ratio of 1:1. Also, X2 has a primary inductor (L3) and a secondary inductor (L4) with a ratio of 1:1. As shown, L1 is coupled across the output of a first differential amplifier 102, and L3 is coupled across the output of the second differential amplifier 104. Meanwhile, L2 and L4 are coupled in series. Specifically, a first end of L2 is coupled to a load ($R_L$), a second end of L2 is coupled to a first end of L4, and a second end of L4 is coupled to a ground node (to provide a single-ended output to $R_L$). With the arrangement of the first power amplifier topology 100, the circuit is assumed to be ideal (e.g., no parasitic capacitance), resulting in an impedance looking into L1 of $0.5*R_L$ and an impedance looking into L3 of $0.5*R_L$. By using multiple transformers, the first power amplifier topology 100 is able to increase the amount of power to $R_L$.

FIG. 1B is a schematic diagram showing a second power amplifier topology 110 with the same components and arrangement described for the first power amplifier topology 100 of FIG. 1A, except where noted. For example, FIG. 1B accounts for parasitic capacitances (C1-C4) in the second power amplifier topology 110, where C1 is between the first end of L2 and ground, C2 is between the second end of L2 and ground, C3 is between the first end of L4 and ground, and C4 is between the second end of L4 and ground. The values of C1-C4 are a function of manufacturing X1 and X2 as part of an IC. With C1-C4, the impedance looking into L1 is $R_1$ and the impedance looking in L3 is $R_2$, where $R_1$ and $R_2$ will vary depending on C1-C4. With the second power amplifier topology 110, there is asymmetry in the amount of power provided by X1 and X2 to $R_L$, resulting in reduced power and lower efficiency.

FIG. 1C is a schematic diagram showing a third power amplifier topology 120 with the same components and arrangement described for the second power amplifier topology 110 of FIG. 1B, except where noted. In the third power amplifier topology 120, a 180° hybrid circuit 122 is added between the first end of L2 and the second end of L4. The output of the 180° hybrid circuit 122 is coupled to $R_L$, where the operation of the 180° hybrid circuit 122 improves the balance of the outputs of X1 and X2. With the third power amplifier topology 120, the 180° hybrid circuit 122 improves the asymmetry issue caused by C1-C4 at the cost of power loss and lower efficiency.

FIG. 1D is a schematic diagram showing a fourth power amplifier topology 130 with the same components described for the second power amplifier topology 110 of FIG. 1B, except where noted. In the fourth power amplifier topology 130, the secondary coils (L2 and L4) of X1 and X2 are in parallel, where the first ends of L2 and L4 are coupled to a first end of $R_L$, and where the second ends of L2 and L4 are grounded. With the fourth power amplifier topology 130, a 1:4 transformer winding is used for X1 and X2, resulting in a lower quality factor (Q), which results in power loss and lower efficiency.

As described in FIGS. 1B-1D, efforts to create a power amplifier IC are made more difficult by parasitic capacitances (e.g., C1-C4). Efforts to improve power amplifier IC efficiency and power output are ongoing.

SUMMARY

In accordance with an embodiment of the description, a system includes a first differential amplifier and a first transformer with a primary coil coupled to an output of the first differential amplifier and with a secondary coil coupled to a load. The system also includes a second differential amplifier and a second transformer with a primary coil coupled to an output of the second differential amplifier and with a secondary coil coupled in series with the secondary coil of the first transformer. The system also includes a tuning network coupled to a center tap node between the secondary coil of the first transformer and the secondary coil of the second transformer.

In accordance with an embodiment of the description, a power amplifier circuit comprises a first set of differential amplifier output nodes and a first transformer with a first primary coil coupled between the first set of differential amplifier output nodes and with a first secondary coil coupled to an output node. The power amplifier circuit also comprises a second set of differential amplifier output nodes and a second transformer with a second primary coil coupled between the second set of differential amplifier output nodes and with a second secondary coil in series with the first secondary coil. The power amplifier circuit also comprises a tuning network coupled to a center tap node between the first secondary coil of and the second secondary coil of the second transformer.

In accordance with an embodiment of the description, an integrated circuit comprises a first transformer with a first primary coil coupled to a first amplifier output of a power amplifier and with a first secondary coil coupled to an output node. The integrated circuit also comprises a second transformer with a second primary coil coupled to a second amplifier output of the power amplifier and with a second secondary coil coupled in series with the first secondary coil. The integrated circuit also comprises a tuning network coupled to a center tap node between the first secondary coil and the second secondary coil, in which the harmonic tuning network is configured to reduce parasitic capacitances at multiple integer frequencies relative to a fundamental operating frequency of the power amplifier.

DETAILED DESCRIPTION

Described herein are power amplifier topologies with a plurality of transformers, each transformer having a primary (input side) inductor and a secondary (output side) inductor formed using windings, transmission lines, or other inductors. In the described power amplifier topologies, the secondary inductors of the transformers are in series, where the nodes between adjacent secondary inductors of the transformers are referred to as center tap nodes. To cancel parasitic capacitances at multiple integer frequencies relative to a fundamental operating frequency (e.g., $n*f_0$, where n is an integer and $f_0$ is the fundamental operating frequency), the power amplifier topologies couple a harmonic tuning network to one or each center tap node between the secondary inductors of a power amplifier topology. In some example embodiments, n is an odd integer (e.g., 1, 3, 5, etc.) and is limited to a predetermined set of integers (e.g., n=1 and 3, n=1, 3, 5, or n=1, 3, 5, 7, etc.). To cancel parasitic capacitances at multiple integer frequencies relative to a fundamental operating frequency of a power amplifier, the harmonic tuning network may employ different topologies and/or components to resonate at the frequencies of interest. Example components for the harmonic tuning network include transformers, transmission lines, inductors, and/or capacitors. In some example embodiments, the harmonic tuning network includes adjustable components to adjust the fundamental operating frequency (e.g., to support different frequency bands) and/or to fine tune the frequencies at which the harmonic tuning network resonates to cancel parasitic capacitances at multiple integer frequencies.

In some example embodiments, the power amplifier components, including the harmonic tuning network, are components of an integrated circuit (IC). In other example embodiments, a power amplifier topology with a harmonic tuning network includes off-chip components. Also, in some example embodiments, a power amplifier topology includes three or more transformers formed using primary and secondary inductors, such that there are a plurality of center tap nodes. In such case, a separate tuning network may be coupled to each center tap node. With the described power amplifier topologies, parasitic capacitances on the output side of a power amplifier are reduced, which improves the amount of power output and the efficiency. In the described power amplifier topologies, various example IC embodiments are given without limitation to other IC embodiments or off-chip options. To provide a better understanding, various power amplifier topology options, harmonic tuning network options, and IC options are described using the figures as follows.

Figure 1A:
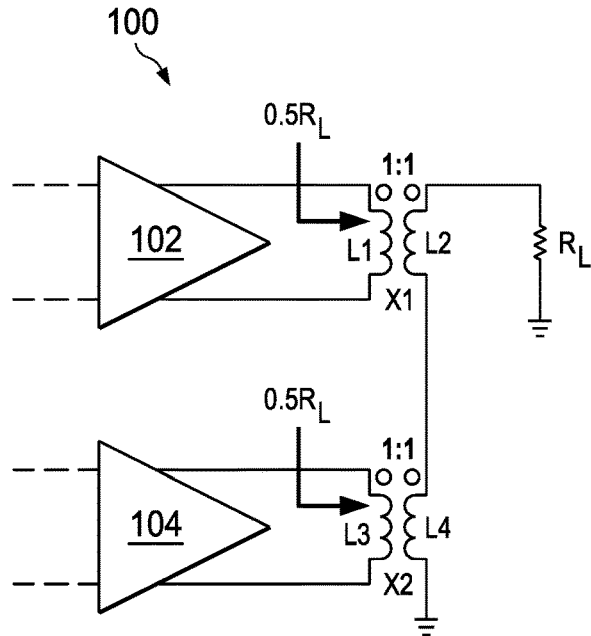
FIG. 1A is a schematic diagram showing a first power amplifier topology.
Figure 1B:
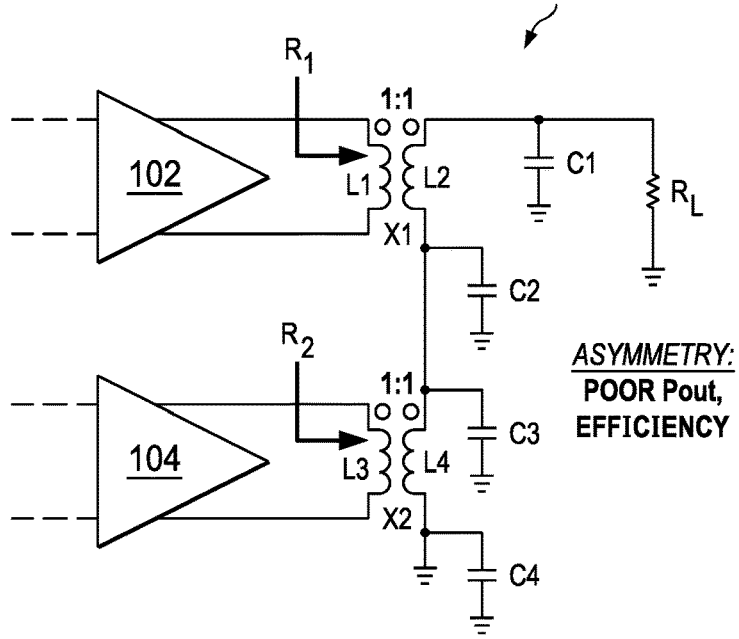
FIG. 1B is a schematic diagram showing a second power amplifier topology.
Figure 1C:
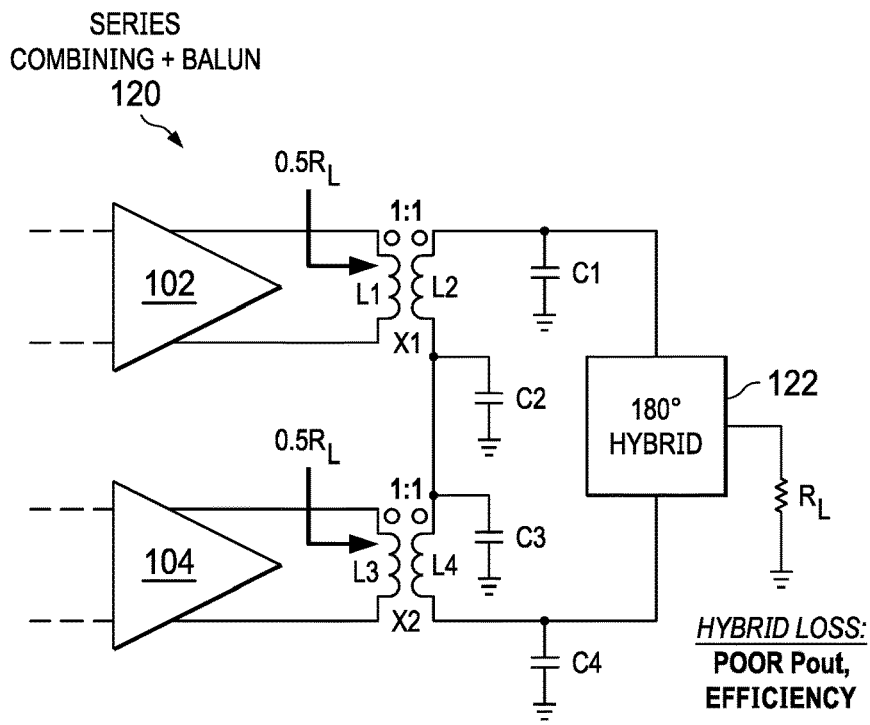
FIG. 1C is a schematic diagram showing a third power amplifier topology.
Figure 1D:
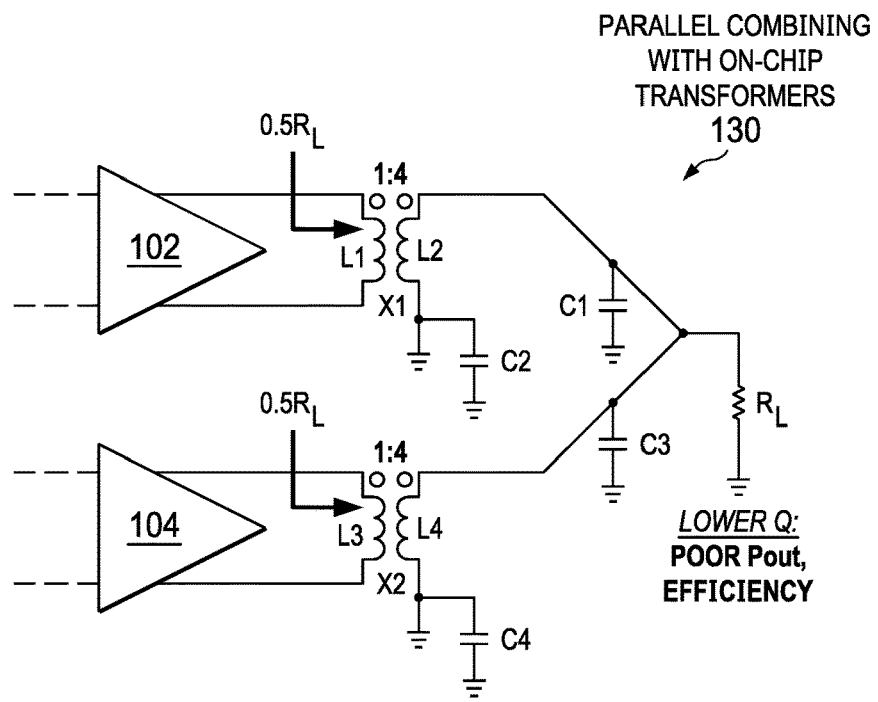
FIG. 1D is a schematic diagram showing a fourth power amplifier topology.
Figure 2:
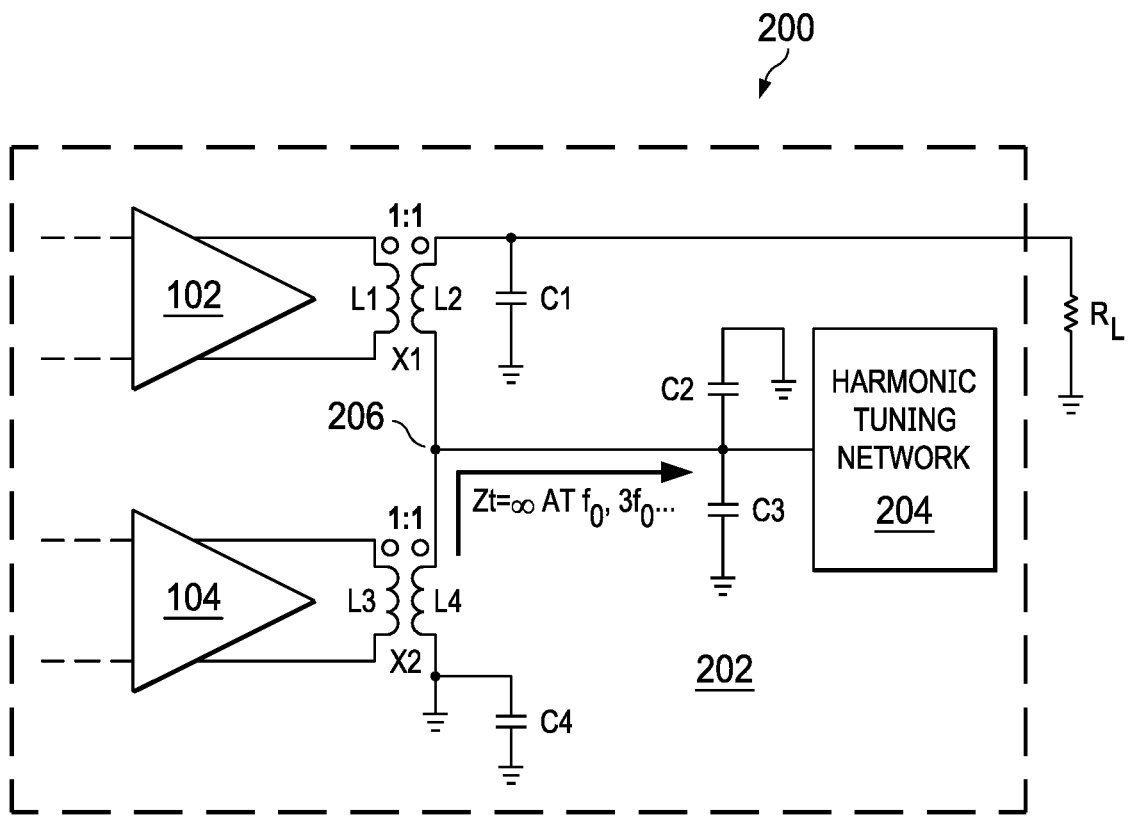
FIG. 2 is a schematic diagram showing a power amplifier topology with a harmonic tuning network in some examples.

FIG. 2 is a schematic diagram showing a power amplifier topology 200 with a harmonic tuning network 204 in some examples. In FIG. 2, the power amplifier topology 200 includes the same components as represented for the power amplifier topology 110 of FIG. 1B, except where noted. In that regard, the power amplifier topology 200 includes differential amplifiers 102 and 104 coupled to transformers X1 and X2 respectively. Transformer X1 includes coils L1 and L2, and transformer X2 includes coils L3 and L4. In addition, a harmonic tuning network 204 is coupled to the center tap node 206 between L2 and L4. With the harmonic tuning network 204 coupled to the center tap node 206, at least some of the parasitic capacitances due to C1-C4 are canceled, which improves the output power and efficiency of the power amplifier topology 200 relative to the power amplifier topologies represented in FIGS. 1A-1D. In the example of FIG. 2, the impedance as a function of time (Zt) of C2, C3, and the harmonic tuning network 204 is high (approximated as ∞) at least at $1*f_0$ and $3*f_0$, which cancels out the parasitic capacitances at these frequencies, where $f_0$ is the fundamental operating frequency of the power amplifier. Note: Zt does not include even harmonics of $f_0$ because these even harmonics of $f_0$ do not pass through the coils of transformers X1 and X2.

Figure 3A:
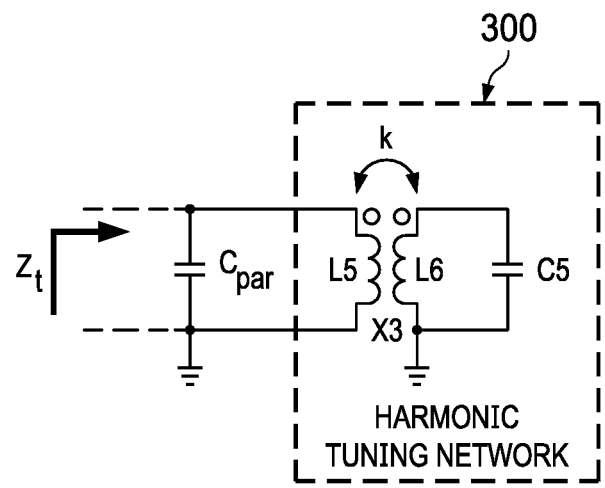
FIG. 3A is a schematic diagram showing a first harmonic tuning network in some examples.

FIGS. 3A-3D are schematic diagrams showing harmonic tuning networks 300, 310, 320, 330 (different examples of the harmonic tuning network 204 in FIG. 2) in accordance with different embodiments. In FIGS. 3A-3D, the respective harmonic tuning networks 300, 310, 320, 330 are shown in parallel with a parasitic capacitance ($C_{par}$). As an example, $C_{par}$ is due to C1-C4 in the example of FIG. 2. In FIG. 3A, the first harmonic tuning network 300 is a transformer-based resonator with a transformer, T3, formed by inductors L5 and L6. The first harmonic tuning network 300 also includes a capacitor, C5, in parallel with L6. In the example of FIG. 3A, Zt of Cpar and the first harmonic tuning network 300 during operations of the power amplifier is high at least at $n*f_0$, where n=1 and 3, and/or other odd integers, which cancels out the parasitic capacitances at these frequencies.

Figure 3B:
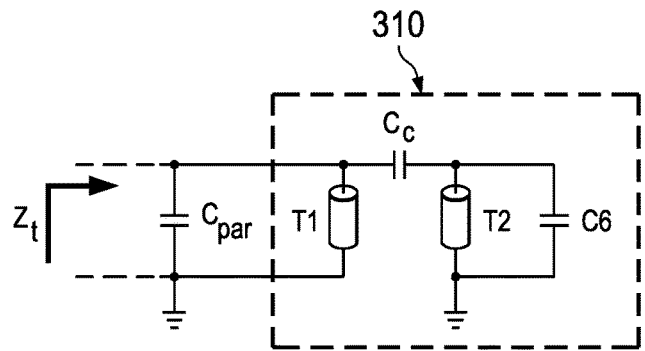
FIG. 3B is a schematic diagram showing a second harmonic tuning network in some examples.

In FIG. 3B, the second harmonic tuning network 310 is a shunt transmission line-based resonator with a first transmission line, T1. The second harmonic tuning network 310 also includes a second transmission line, T2, in parallel with a capacitor (C6). Between T1 and T2 is a coupling capacitor (C$_c$). In the example of FIG. 3B, Zt of Cpar and the harmonic tuning network 310 during operations of the power amplifier is high at least at n*f$_0$, where n=1 and 3, and/or other odd integers, which cancels out the parasitic capacitances at these frequencies.

Figure 3C:
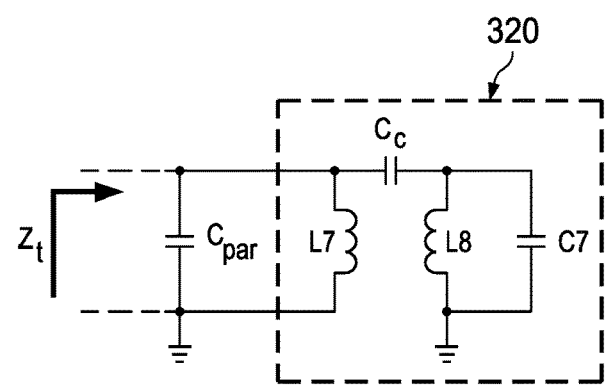
FIG. 3C is a schematic diagram showing a third harmonic tuning network in some examples.

In FIG. 3C, the third harmonic tuning network 320 is a capacitively-coupled resonator. As shown, third harmonic tuning network 320 includes a first inductor, L7. The third harmonic tuning network 320 also includes a second inductor, L8, in parallel with a capacitor (C7). Between L7 and L8 is a coupling capacitor (C$_c$). In the example of FIG. 3C, Zt of Cpar and the harmonic tuning network 320 during operations of the power amplifier is high at least at n*f$_0$, where n=1 and 3, and/or other odd integers, which cancels out the parasitic capacitances at these frequencies.

Figure 3D:
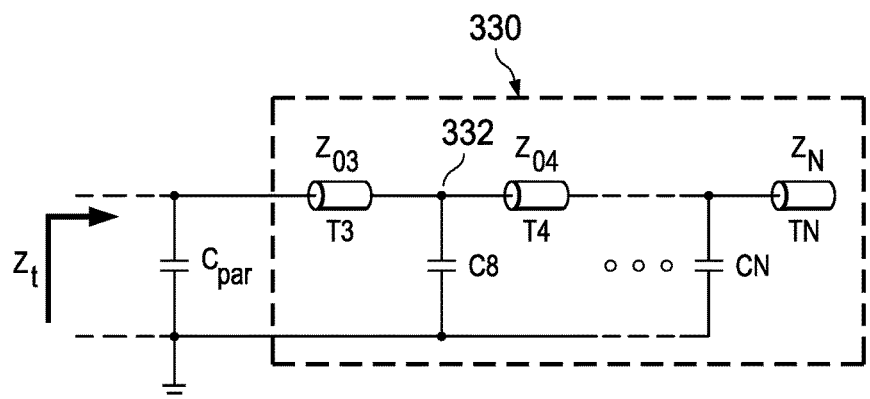
FIG. 3D is a schematic diagram showing a fourth harmonic tuning network in some examples.

In FIG. 3D, the fourth harmonic tuning network 330 is a series transmission line-based resonator. As shown, the fourth harmonic tuning network 330 includes a plurality of transmissions lines T3-TN with respective impedances ($Z_{O3}$-$Z_N$). Between T3 and T4 is a node 332, where a capacitor (C8) is coupled between the node 332 and a ground node. With the fourth harmonic tuning network 330, additional transmission lines and capacitors may be added. In the example of FIG. 3D, the Zt of Cpar and the harmonic tuning network 330 during operations of the power amplifier is high at least at n*f$_0$, where n=1 and 3, and/or other odd integers, which cancels out the parasitic capacitances at these frequencies.

Figure 4:
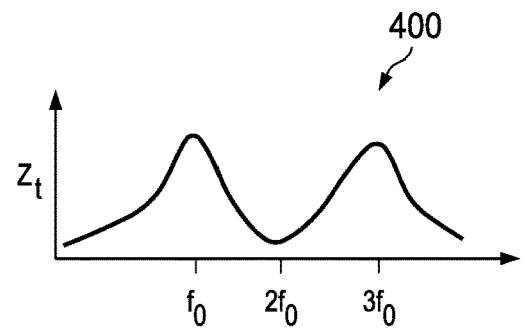
FIG. 4 is a graph showing impedance of a harmonic tuning network as a function of a frequency in some examples.

FIG. 4 is a graph 400 showing impedance of a harmonic tuning network (e.g., the harmonic tuning networks 204, 300, 310, 320, 330 of FIGS. 2 and 3A-3D) as a function of a frequency in some examples. As shown in the graph 400, the impedance is higher at f$_0$ and 3*o. With the impedance profile represented in graph 400, a harmonic tuning network is able to approximate an open circuit at f$_0$ and 3*$_0$. Thus, at f$_0$ and 3*$_0$, the harmonic tuning network effectively cancels out parasitic capacitances in parallel with the harmonic tuning network. In other example embodiments, the impedance profile of a harmonic tuning network varies from the example given in FIG. 4 (e.g., high impedance at n*f$_0$, where n=1, 3, 5, and/or other integers).

Figure 5:
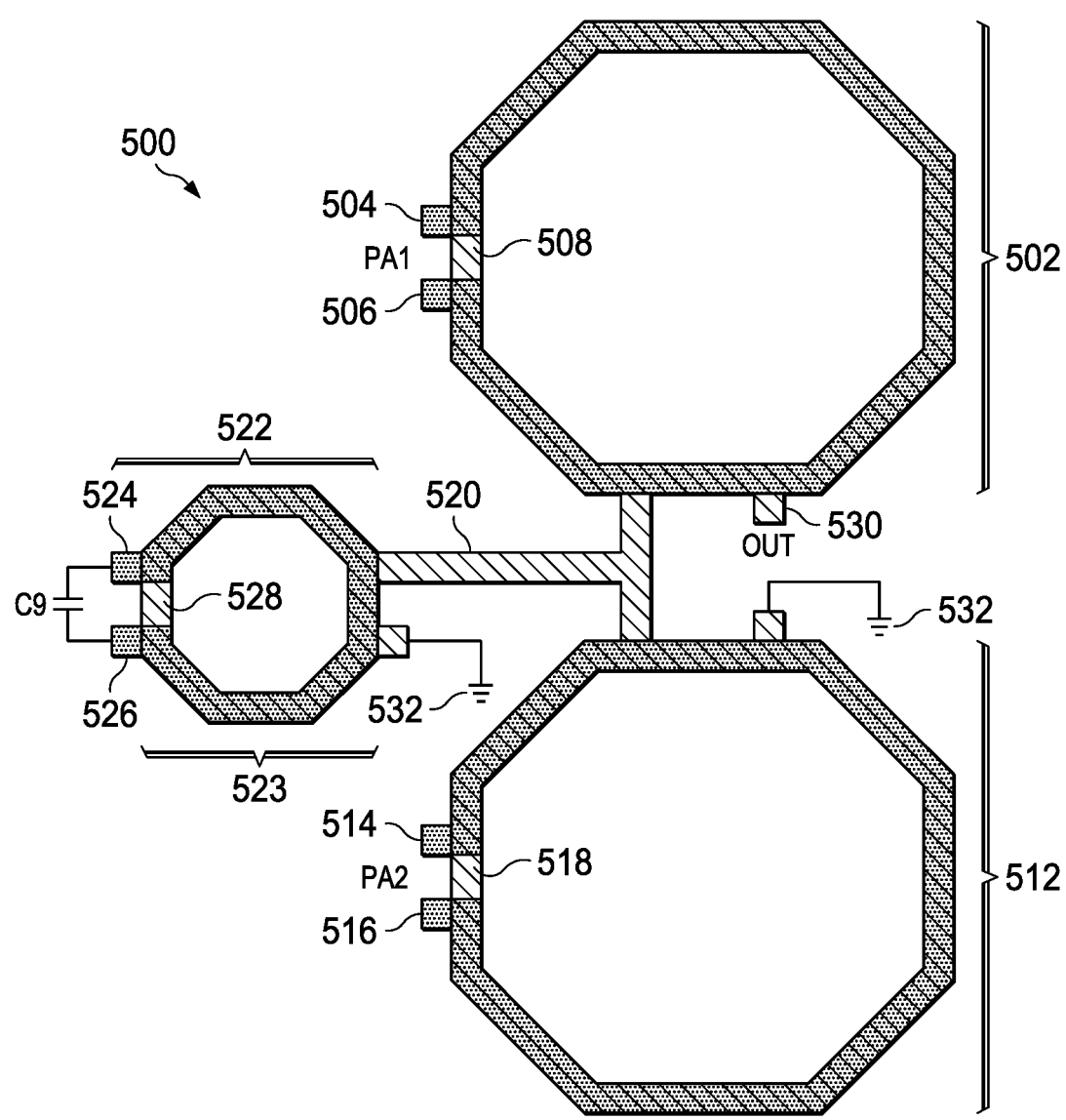
FIG. 5 is a top view showing a first arrangement of power amplifier components for an integrated circuit (IC) in some examples.

FIG. 5 is a top view showing a first arrangement 500 of power amplifier components for an IC in some examples. In the first arrangement 500 of FIG. 5, each of the transformers 502 and 512 (an example of X1 and X2 in FIG. 2) are formed using a first 2-way combining option. More specifically, the first arrangement 500 includes a first transformer 502 with overlapping coils, where the secondary coil 508 is visible and covers the primary coil. In the example of FIG. 5, the contacts 504 and 506 are coupled to the primary coil of the first transformer 502 and are configured to receive a first differential amplifier output (PA1). Also, the secondary coil 508 of the first transformer 502 is coupled to an output node 530. The first arrangement 500 also includes a second transformer 512 that includes overlapping coils, where the secondary coil 518 is visible and covers the primary coil. In the example of FIG. 5, the contacts 514 and 516 are coupled to the primary coil of the second transformer 512 and are configured to receive a second differential amplifier output (PA2). Also, the secondary coil 518 of the second transformer 512 is coupled to a ground node 532. Between the secondary coils 508 and 518 is a center tap node 520 that couples to a harmonic tuning network 522.

In the first arrangement 500 of FIG. 5, the harmonic tuning network 522 (an example of the harmonic tuning network 300 in FIG. 3) includes a transformer 523, which has overlapping coils, where a first coil 528 of the transformer 523 is visible, and where different portions of the first coil 528 are coupled to the center tap node 520 and to the ground node 532. Meanwhile, different ends of the second coil (covered by the first coil 528) of the transformer 523 are coupled to contacts 524 and 526, where a capacitor (C9) is coupled between the contacts 524 and 526. With the harmonic tuning network 522 coupled to the center tap node 520 between secondary coils 508 and 518 of the first and second transformers 502 and 512, parasitic capacitances at target frequencies (e.g., n*f$_0$, where n=1, 3, and/or other odd integers) are reduced, which increases the amount of output power provided and the efficiency of a power amplifier with the first arrangement 500.

Figure 6A:
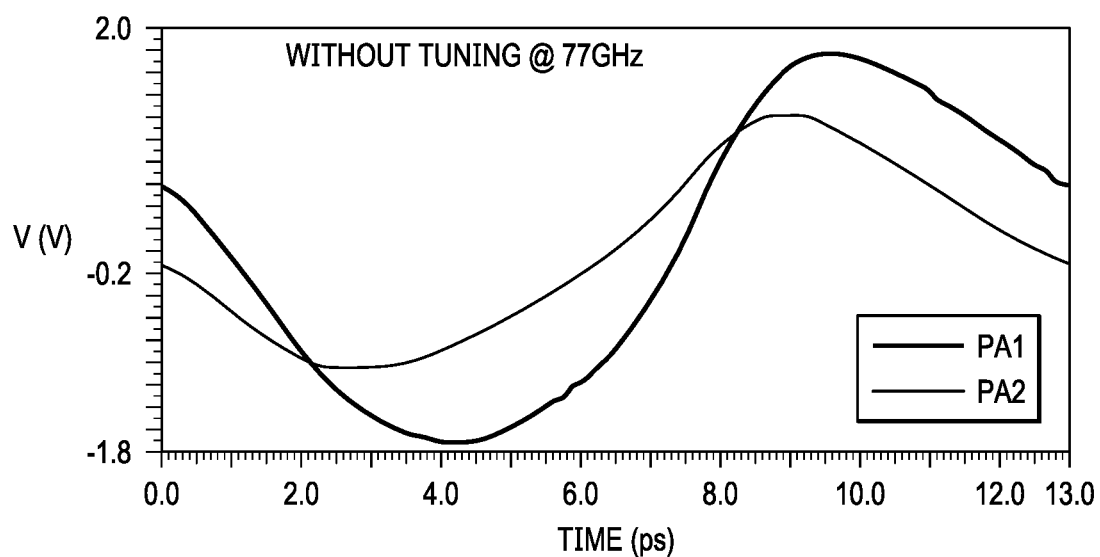
FIG. 6A is a graph showing voltage waveforms of a power amplifier as a function of time without a harmonic tuning network.

FIG. 6A is a graph 600 showing voltage waveforms of a power amplifier as a function of time without a harmonic tuning network. For the graph 600, no harmonic tuning network is used, resulting in a large offset between the output of differential power amplifiers PA1 and PA2.

Figure 6B:
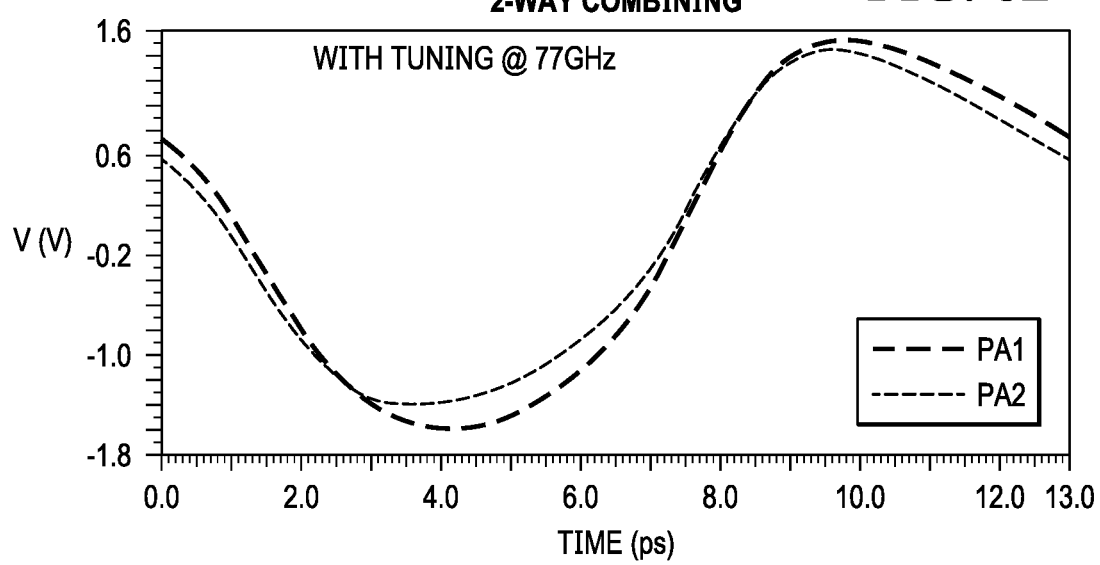
FIG. 6B is a graph showing voltage waveforms of a power amplifier as a function of time with a harmonic tuning network.

FIG. 6B is a graph 610 showing voltage waveforms of a power amplifier as a function of time with harmonic tuning network based on a first 2-way combining option (e.g., the arrangement of transformers and a harmonic tuning network as described for the first arrangement 500 of FIG. 5 is assumed). As shown in graph 610, the tuning provided by a harmonic tuning network reduces the amount of error between the output of differential power amplifiers PA1 and PA2 as seen by the power amplifier. This reduction in error increases the amount of output power provided and the efficiency of a power amplifier with the first 2-way combining option (e.g., the first arrangement 500 in FIG. 5).

Figure 7:
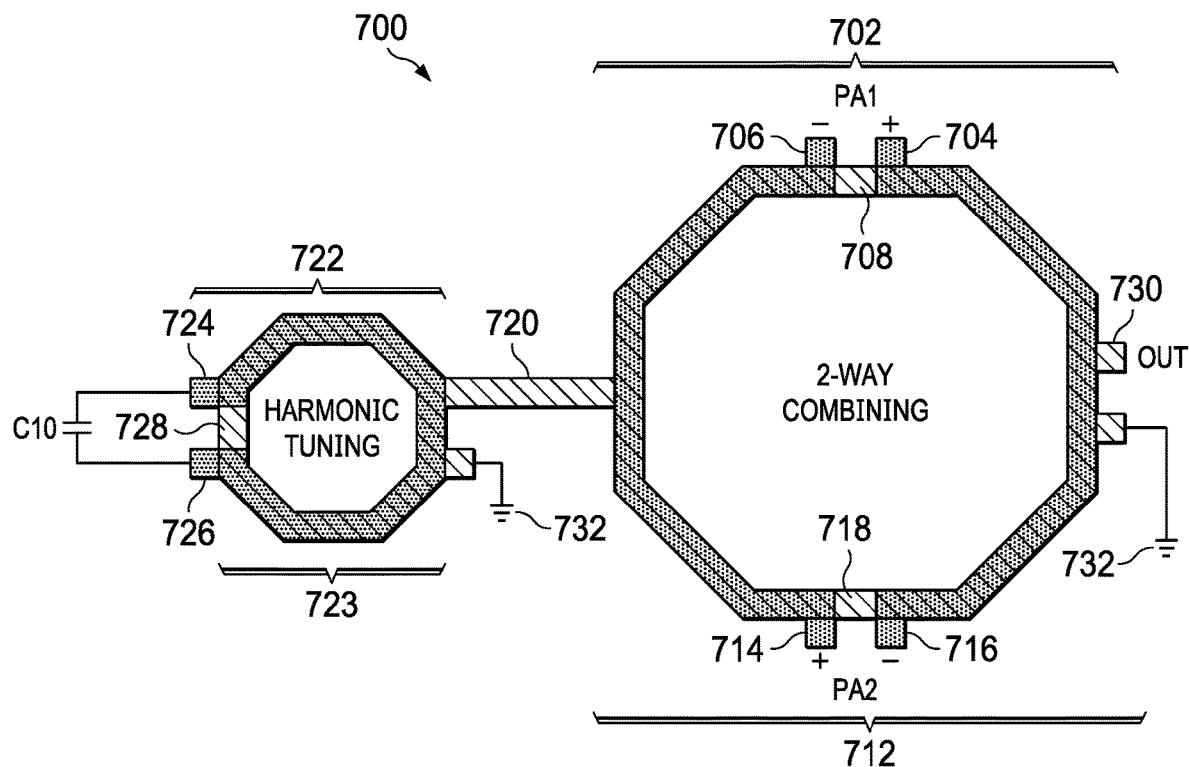
FIG. 7 is a top view showing a second arrangement of power amplifier components for an IC in some examples.

FIG. 7 is a top view showing a second arrangement 700 of power amplifier components for an IC in some examples. In the second arrangement 700 of FIG. 7, a second 2-way combining option (e.g., a distributed active transformer (DAT) topology) is used to form a first transformer 702 and a second transformer 712 (e.g., X1 and X2 in FIG. 2). More specifically, the first transformer 702 includes overlapping partial coils, where the partial secondary coil 708 is visible and covers the partial primary coil. In the example of FIG. 7, the contacts 704 and 706 are coupled to the partial primary coil of the first transformer 702 and are configured to receive a first differential amplifier output (PA1). Also, the partial secondary coil 708 of the first transformer 702 is coupled to an output node 730. The second arrangement 700 also includes a second transformer 712 that includes overlapping partial coils, where the partial secondary coil 718 is visible and covers the partial primary coil. In the example of FIG. 7, the contacts 714 and 716 are coupled to the partial primary coil of the second transformer 712 and are configured to receive a second differential amplifier output (PA2). Also, the partial secondary coil 718 of the second transformer 712 is coupled to a ground node 732. Between the partial secondary coils 708 and 718 is a center tap node 720 that couples to a harmonic tuning network 722 (an example of the harmonic turning network 204 in FIG. 2).

In the second arrangement 700 of FIG. 7, the harmonic tuning network 722 includes a transformer 723, which includes overlapping coils, where a first coil 728 of the transformer 723 is visible, and where different portions of the first coil 728 are coupled to the center tap node 720 and to the ground node 732. Meanwhile, different ends of the second coil (covered by the first coil 728) of the transformer 723 are coupled to contacts 724 and 726, where a capacitor (C10) is coupled between the contacts 724 and 726. With the harmonic tuning network 722 coupled to the center tap node 720 between secondary coils 708 and 718 of the first and second transformers 702 and 712, parasitic capacitances at target frequencies (e.g., $n*f_O$, where n=1, 3, and/or other odd integers) are reduced, which increases the amount of output power provided and the efficiency of a power amplifier with the second arrangement 700.

Figure 8A:
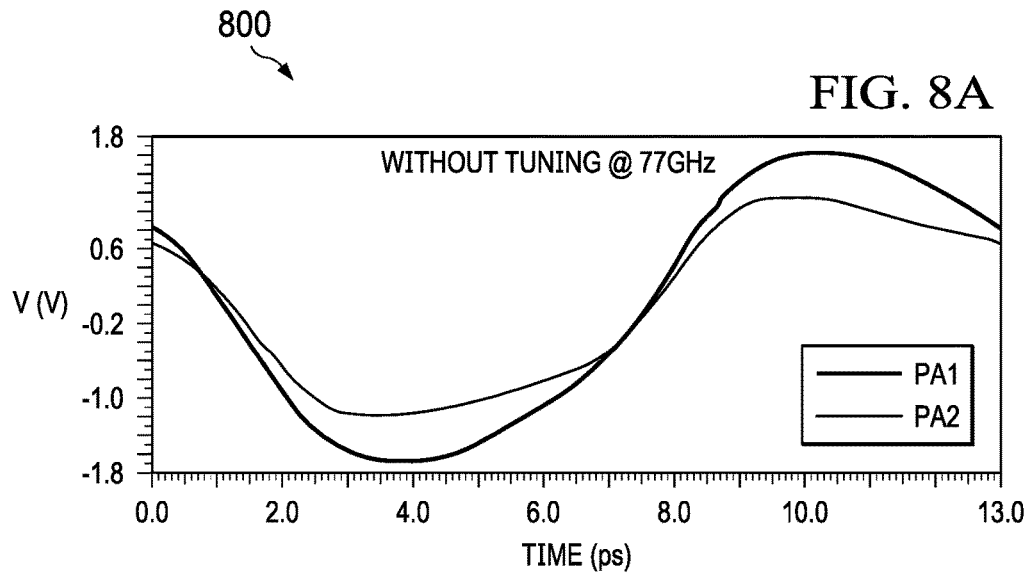
FIG. 8A is a graph showing voltage waveforms of a power amplifier as a function of time without a harmonic tuning network.
Figure 8B:
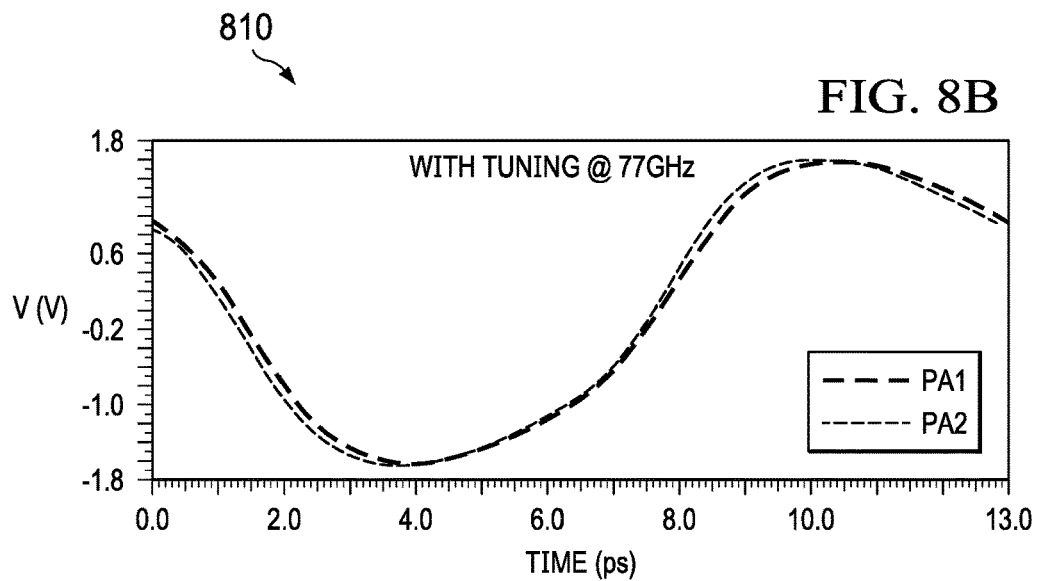
FIG. 8B is a graph showing voltage waveforms of a power amplifier as a function of time with a harmonic tuning network.

FIGS. 8A and 8B are graphs 800 and 810 showing voltage waveforms of a power amplifier as a function of time with and without a harmonic tuning network. For graph 810, a 2-way combining option similar to the arrangement of transformers and harmonic tuning network described in FIG. 7 is implemented). As shown by comparing graph 800 to graph 810, the tuning provided by a harmonic tuning network reduces the amount of error between the values of the first differential amplifier output (PA1) and the second differential amplifier output (PA2) as seen by the power amplifier. This reduction in error increases the amount of output power provided and the efficiency of a power amplifier with the second 2-way combining option (e.g., the second arrangement 700 in FIG. 7).

Figure 9:
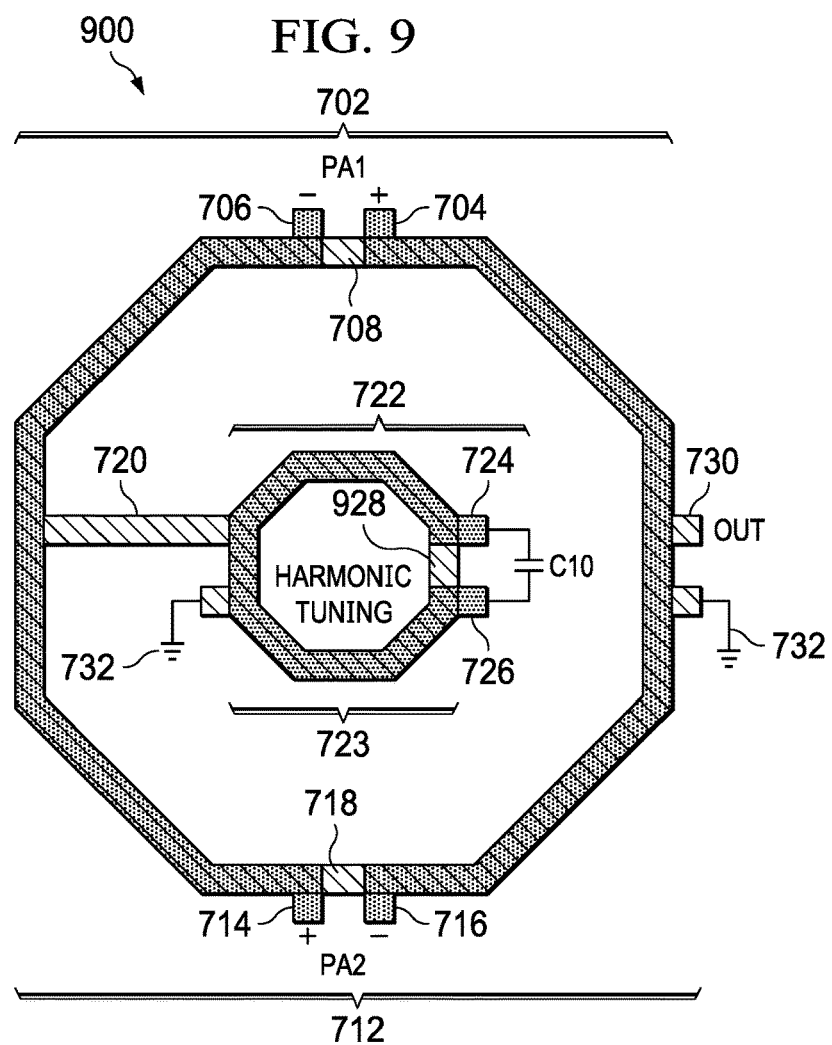
FIG. 9 is a top view showing a third arrangement of power amplifier components for an IC in some examples.

FIG. 9 is a top view showing a third arrangement 900 of power amplifier components for an IC in some examples. In the third arrangement 900 of FIG. 9, the same components introduced for the second arrangement 700 of FIG. 7 are again represented. In contrast to the second arrangement 700 of FIG. 7, the third arrangement 900 of FIG. 9 positions the harmonic tuning network 722 within the footprint of the first and second transformers 702 and 712. With the third arrangement 900, parasitic capacitances at target frequencies (e.g., $n*f_O$, where n=1, 3, and/or other odd integers) are reduced, which increases the amount of output power provided and the efficiency of a power amplifier with the third arrangement 900. Compared to the second arrangement 700 of FIG. 7, the third arrangement 900 of FIG. 9 has a similar performance with a smaller footprint.

Figure 10:
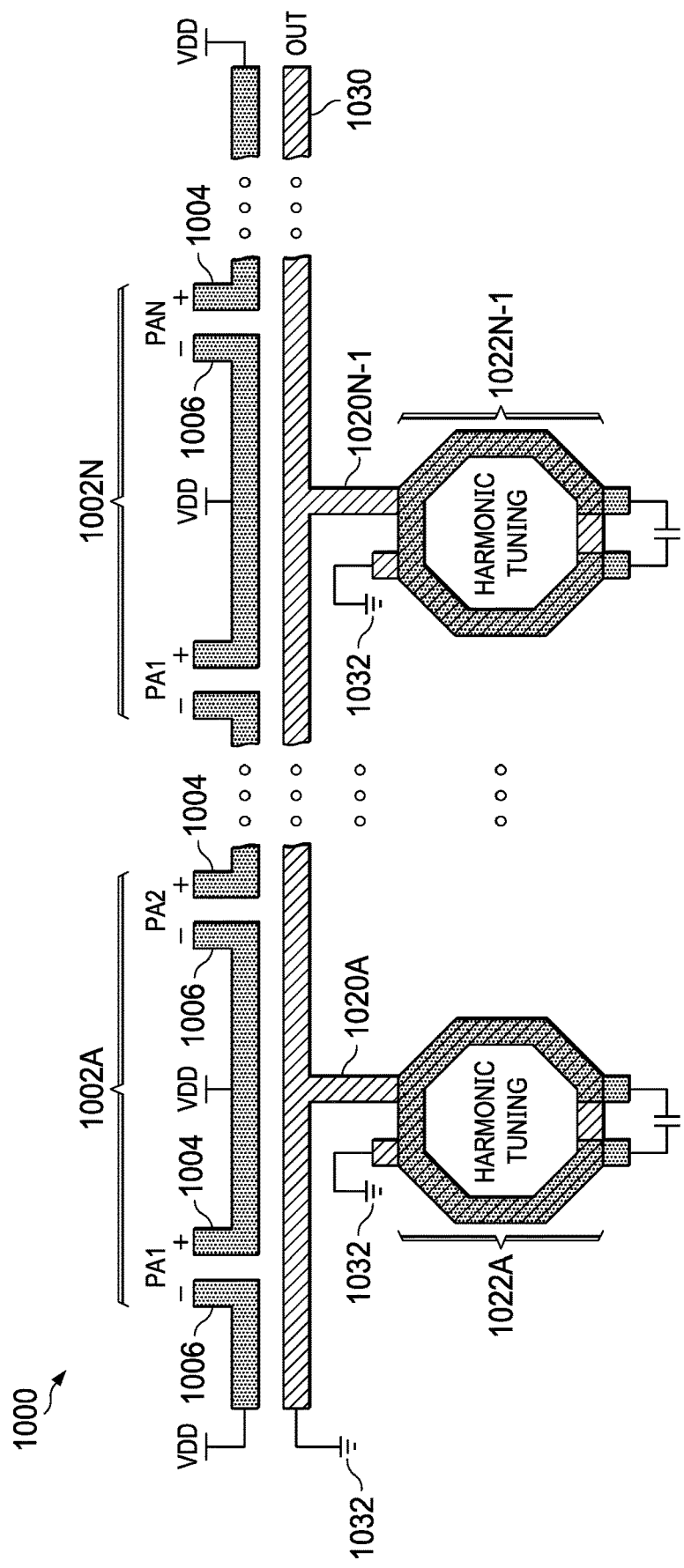
FIG. 10 is a top view showing a fourth arrangement of power amplifier components for an IC in some examples.

FIG. 10 is a top view showing a fourth arrangement 1000 of power amplifier components for an IC in some examples. In the fourth arrangement 1000, transmission line segments 1002A-1002N are used to form a plurality of transformers using an N-way Marchand Balun Combiner topology. In the example of FIG. 10, the Marchand Balun transmission line segments 1002A-1002N form primary inductors and secondary inductors of at least two transformers, where each primary inductor is coupled to a differential amplifier output (PA1) and where each secondary inductor is in series between a ground node 1032 and an output node 1032. In the fourth arrangement 1000, different points along this transmission line function are used as center taps 1020A-1020N-1 where harmonic tuning networks 1022A-1022N-1 (an example of the harmonic turning network 204 in FIG. 2) are coupled each of the center taps 1020A-102M. As shown, the harmonic tuning network 1022A-1022N-1 have the same 2-way combining arrangement as described for the harmonic tuning networks in FIGS. 5, 7, and 9. With the fourth arrangement 1000, parasitic capacitances at target frequencies (e.g., $n*f_O$, where n=1, 3, and/or other odd integers) are reduced, which increases the amount of output power provided at the output node 1030 and the efficiency of a power amplifier with the fourth arrangement 1000.

Figure 11:
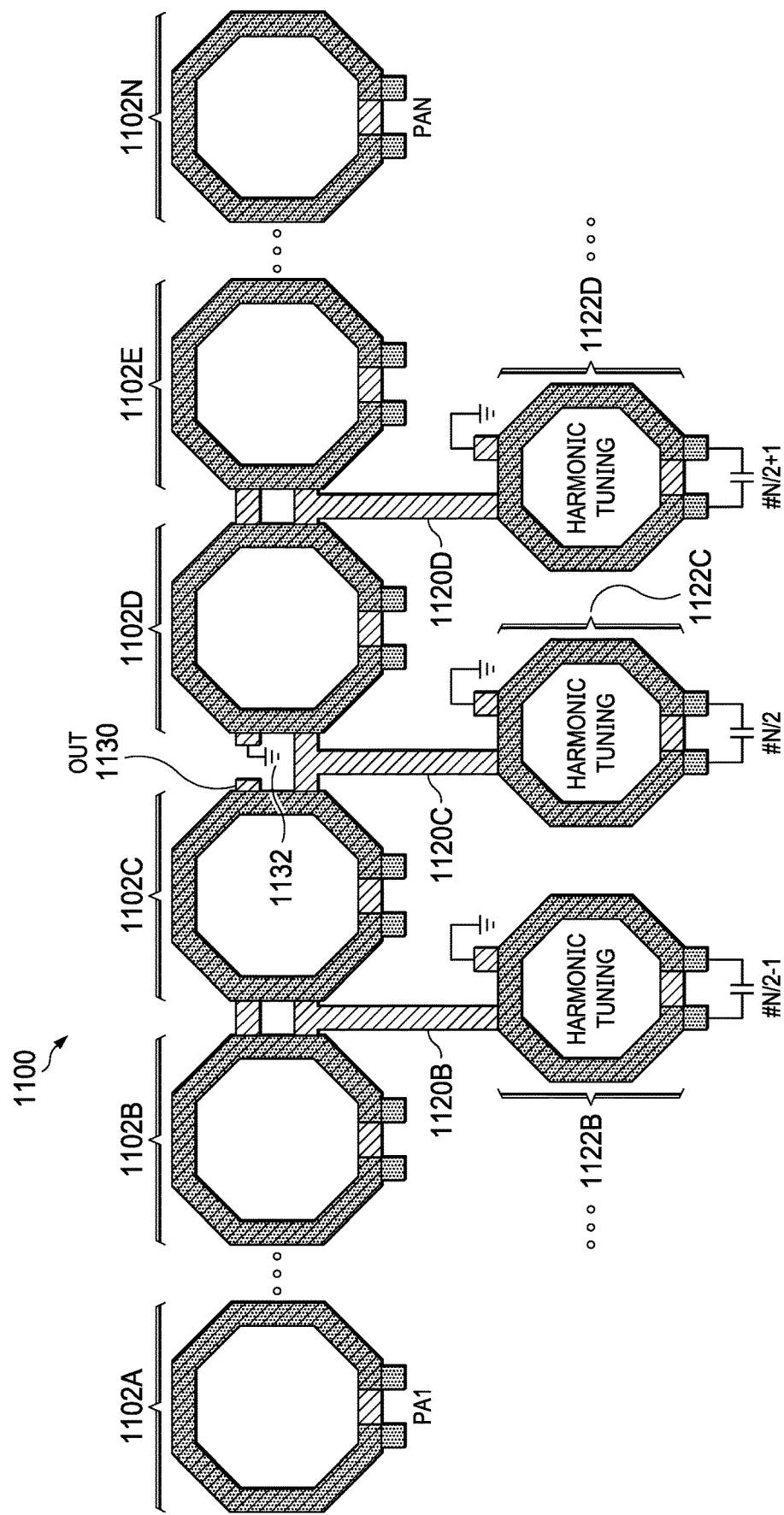
FIG. 11 is a top view showing a fifth arrangement of power amplifier components for an IC in some examples.

FIG. 11 is a top view showing a fifth arrangement 1100 of power amplifier components for an IC in some examples. In the fifth arrangement 1100 of FIG. 11, each of a plurality of transformers 1102A-1102N includes overlapping coils formed using an N-way combining option. More specifically, each of the transformers 1102A-1102N has a primary coil coupled to a differential amplifier output (PA1-PAN) and a secondary coil coupled in series between a ground node 1132 and an output node 1130. The fifth arrangement 500 also includes a plurality of harmonic tuning networks 1122B-1122D (an example of the harmonic turning network 204 in FIG. 2) coupled to respective center tap node 1120B-1120D. In the fifth arrangement 1100, each of the harmonic tuning networks 1122B-1122D has the same arrangement as described for the harmonic tuning networks in FIGS. 5, 7, 9, and 10. While there are only three harmonic tuning networks 1122B-1122D represented in FIG. 11, it should be appreciated that the fifth arrangement 1100 includes additional harmonic tuning networks as needed (e.g., one for each center tap node). With the harmonic tuning networks (e.g., harmonic tuning networks 1122B-1122D) represented in FIG. 11, parasitic capacitances at target frequencies (e.g., $n*f_O$, where n=1, 3, and/or other odd integers) are reduced, which increases the amount of output power provided to the output node 1130 and the efficiency of the power amplifier with the fifth arrangement 1100.

Figure 12:
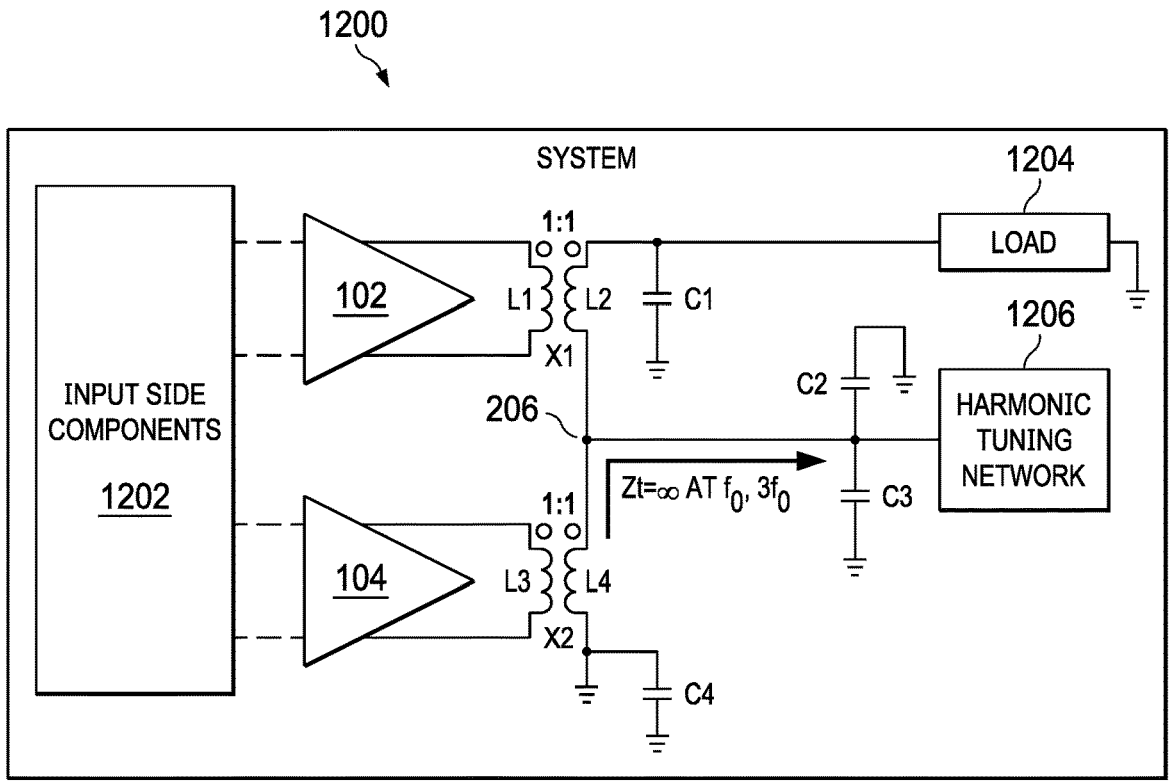
FIG. 12 is a block diagram showing a system in some examples.

FIG. 12 is a block diagram showing a system 1200 in some examples. In some example embodiments, the system 1200 is an automotive radar system. In other example embodiments, the system 1200 is another communication system with a radio-frequency (RF) transmitter/transceiver, or any radar system (e.g., imaging, surveillance, and weather radars). As shown, the system 1200 includes the various components represented in the power amplifier topology 200 of FIG. 2. In the system 1200, input-side components are coupled to the first and second differential amplifiers 102 and 104. Examples of the input-side components include driver amplifiers, power splitters, an upconversion mixer or modulator, filters, detectors, phase shifters etc. Also, a harmonic tuning network 1206 (an example of the harmonic tuning network 204 in FIG. 2, the harmonic tuning networks 300, 310, 320, or 330 in FIGS. 3A-3D, the harmonic tuning network 522 in FIG. 5, the harmonic tuning network 722 in FIG. 7, the harmonic tuning network 922 in FIG. 9, the harmonic tuning network 1022A-1022M in FIG. 10, or the harmonic tuning networks 1122B-1122D in FIG. 11) is coupled to the center tap node 206 between L2 and L4. With the harmonic tuning network 1206, parasitic capacitances at target frequencies (e.g., $n*f_O$, where n=1, 3, and/or other odd integers) are reduced, which increases the amount of output power provided to a load 1204 and improves the efficiency of the system 1200. In an automotive radar system example, the load 1204 is a radar antenna. In other examples, the load 1204 is a duplexing circuit such as a transmit/receive switch, a circulator, or a diplexer. Another load example is an external discrete power amplifier manufactured in a III-V or SiGe process.

Figure 13:
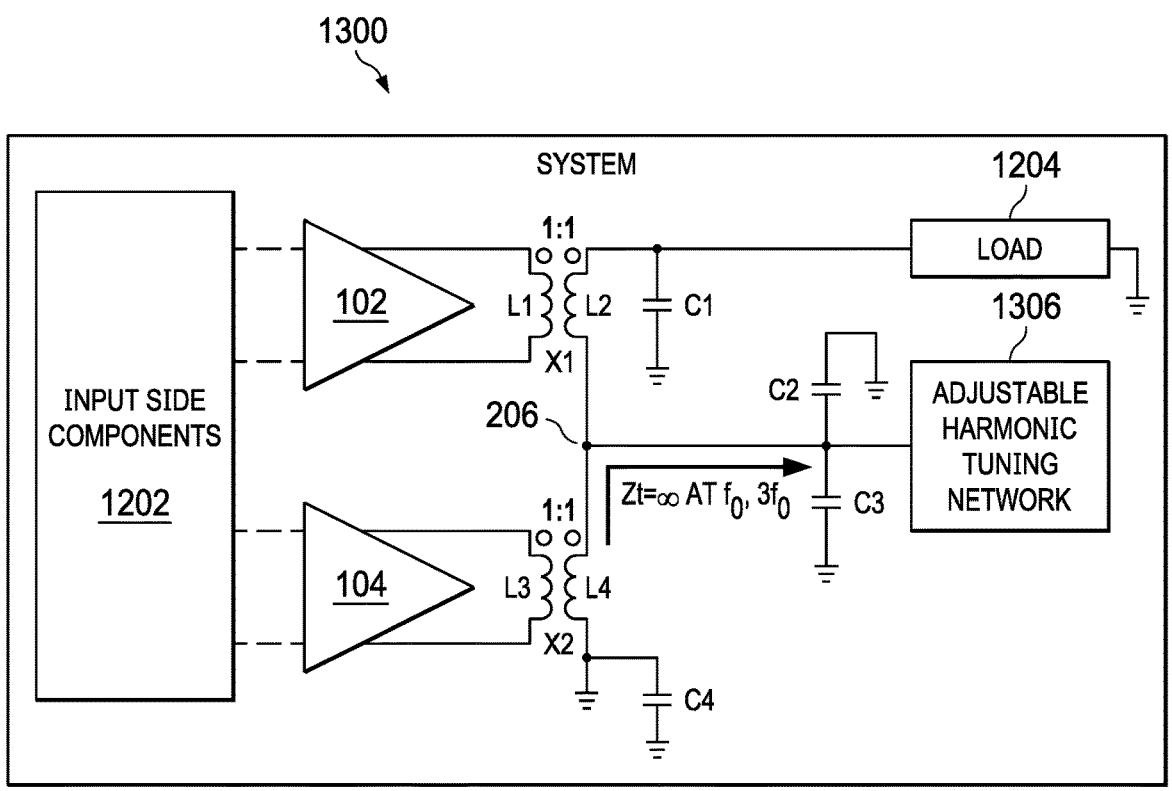
FIG. 13 is a block diagram showing a system in some examples.

FIG. 13 is a block diagram showing a system 1300 in some examples. In some example embodiments, the system 1300 is an automotive radar system. In other example embodiments, the system 1300 is another communication system with a radio-frequency (RF) transmitter/transceiver, or any radar system (e.g., imaging, surveillance, and weather radars). As shown, the system 1300 includes the various components represented in the power amplifier topology 200 of FIG. 2 and the system 1200 of FIG. 12. In the system 1300, an adjustable harmonic tuning network 1306 is coupled to the center tap node 206 between L2 and L4. With the adjustable harmonic tuning network 1306, parasitic capacitances at target frequencies (e.g., $n*f_O$, where n=1, 3, and/or other odd integers) are reduced, which increases the amount of output power provided to the load 1204 and improves the efficiency of the system 1300. In an automotive radar system example, the load 1204 is a radar driver circuit. In other examples, the load 1204 is a duplexing circuit such as a transmit/receive switch, a circulator, or a diplexer.

Another load example is an external discrete power amplifier manufactured in a III-V or SiGe process.

In some example embodiments, the adjustable harmonic tuning network 1306 includes an adjustable capacitor and/or other adjustable components to enable adjustments to the resonate frequencies of the harmonic tuning network 1306. In one example embodiment, the adjustable harmonic tuning network 1306 is configured to switch between two frequency bands supported by the system 1300. In some example embodiments, a varactor or a switched capacitor bank is used as an adjustable capacitor. An adjustable harmonic tuning network 1306 can also be used for optimizing the power amplifier efficiency and output power under process variations, or load impedance variations (e.g. antenna impedance variations).

In this description, the term "couple" may cover connections, communications, or signal paths that enable a functional relationship consistent with this description. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Modifications are possible in the described embodiments, and other embodiments are possible, within the scope of the claims.

What is claimed is:

1. A system, comprising:
an amplifier circuit having first, second, third, and fourth amplifier inputs, an amplifier output, and a center tap terminal, the amplifier circuit including:
a first differential amplifier having first differential inputs and first differential outputs, the first differential inputs coupled to the first and second amplifier inputs;
a first transformer including a first primary side conductor and a first secondary side conductor, the first primary side conductor coupled to an output of the first differential outputs, and the first secondary side conductor coupled between the amplifier output and the center tap terminal;
a second differential amplifier having second differential inputs and second differential outputs, the second differential inputs coupled to the third and fourth amplifier inputs; and
a second transformer including a second primary side conductor and a second secondary side conductor, the second primary side conductor coupled to an output of the second differential outputs, and the second secondary side conductor coupled between the center tap terminal and a reference terminal; and
a resonator circuit having a resonator terminal coupled to the center tap terminal, the resonator circuit configured to resonate at a frequency based on a fundamental operating frequency of the amplifier circuit.

2. The system of claim 1, wherein the frequency is a first frequency, and the resonator circuit is configured to resonate at frequencies including the first frequency based on odd multiples of the fundamental operating frequency.

3. The system of claim 1, wherein the reference terminal is a first reference terminal, and the resonator circuit includes:
a third transformer including a third primary side conductor and a third secondary side conductor, the third primary side conductor coupled between the resonator terminal and a second reference terminal; and
a capacitor coupled across the third secondary side conductor.

4. The system of claim 1, wherein the reference terminal is a first reference terminal, and the resonator circuit includes:
a first circuit element having first and second ends, the first end coupled to the resonator terminal, and the second end coupled to a second reference terminal;
a second circuit element having third and fourth ends;
a first capacitor coupled between the first end and the third end; and
a second capacitor coupled between the third and fourth ends; and
wherein each of the first and second circuit elements includes a respective inductor or a respective transmission line segment.

5. The system of claim 1, wherein the reference terminal is a first reference terminal, and the resonator circuit includes:
a first transmission line segment having first and second ends, the first end coupled to the resonator terminal;
a second transmission line segment having third and fourth ends, the third end coupled to the second end; and
a capacitor coupled between the second and third ends and a second reference terminal.

6. The system of claim 1, in which the first and second transformers and the resonator circuit are formed on an integrated circuit (IC).

7. The system of claim 1, wherein the resonator circuit is outside a footprint of the first and second transformers.

8. The system of claim 1, wherein the resonator circuit is inside a footprint of the first and second transformers.

9. The system of claim 1, wherein the first and second transformers are part of a Marchand Balun Combiner.

10. The system of claim 1, wherein the center tap terminal is a first center tap terminal, the frequency is a first frequency, the resonator circuit is a first resonator circuit, the resonator terminal is a first resonator terminal, and the system includes:
a third transformer including a third primary side conductor and a third secondary side conductor, the third primary side conductor coupled to the output of the first differential outputs, and the third secondary side conductor coupled between the amplifier output and a second center tap terminal;
a fourth transformer including a fourth primary side conductor and a fourth secondary side conductor, the fourth primary side conductor coupled to the output of the second differential outputs, and the fourth secondary side conductor coupled between the second center tap terminal and the reference terminal; and
a second resonator circuit having a second resonator terminal coupled to the second center tap terminal, the second resonator circuit configured to resonate at a second frequency based on the fundamental operating frequency.

11. The system of claim 1, wherein the resonator circuit includes an adjustable element to set the frequency.

12. An amplifier circuit, comprising:
a first transformer including a first primary side conductor and a first secondary side conductor, the first primary side conductor coupled to a first input, and the first secondary side conductor coupled between an output and a center tap terminal;

a second transformer including a second primary side conductor and a second secondary side conductor, the second primary side conductor coupled to a second input, and the second secondary side conductor coupled between the center tap terminal and a reference terminal; and a resonator circuit having a resonator terminal coupled to the center tap terminal, the resonator circuit configured to resonate at a frequency based on a fundamental operating frequency of amplifier circuit.

13. The amplifier circuit of claim 12, wherein the frequency is a first frequency, and the resonator circuit is configured to resonate at frequencies including the first frequency based on odd multiples of the fundamental operating frequency.

14. The amplifier circuit of claim 12, wherein the reference terminal is a first reference terminal, and the resonator circuit includes:
a third transformer including a third primary side conductor and a third secondary side conductor, the third primary side conductor coupled between the resonator terminal and a second reference terminal; and
a capacitor coupled across the third secondary side conductor.

15. The amplifier circuit of claim 12, wherein the reference terminal is a first reference terminal, and the resonator circuit includes:
a first circuit element having first and second ends, the first end coupled to the resonator terminal, and the second end coupled to a second reference terminal;
a second circuit element having third and fourth ends;
a first capacitor coupled between the first end and the third end; and
a second capacitor coupled between the third and fourth ends; and
wherein each of the first and second circuit elements includes a respective inductor or a respective transmission line segment.

16. The amplifier circuit of claim 12, the reference terminal is a first reference terminal, and the resonator circuit includes:
a first transmission line segment having first and second ends, the first end coupled to the resonator terminal;
a second transmission line segment having third and fourth ends, the third end coupled to the second end; and
a capacitor coupled between the second and third ends and a second reference terminal.

17. The amplifier circuit of claim 12, wherein the first, and second transformers and the resonator circuit are part of an integrated circuit (IC).

18. An, integrated circuit, comprising:
an amplifier circuit having first and second inputs, an output, and a center tap terminal, the amplifier circuit including:
a first transformer including a first primary side conductor and a first secondary side conductor, the first primary side conductor coupled to the first input, and the first secondary side conductor coupled between the output and the center tap terminal; and
a second transformer including a second primary side conductor and a second secondary side conductor, the second primary side conductor coupled to the second input, and the second secondary side conductor coupled between the center tap terminal and a reference terminal; and a resonator circuit having a resonator terminal coupled to the center tap terminal, the resonator circuit configured to resonate at a frequency based on a fundamental operating frequency of the amplifier circuit.

19. The integrated circuit of claim 18, wherein the frequency is a first frequency, and the resonator circuit is configured to resonate at frequencies including the first frequency based on odd multiples of the fundamental operating frequency.

20. The integrated circuit of claim 18, wherein the resonator circuit is inside a footprint of the first and second transformers.

21. The integrated circuit of claim 18, wherein the first and second transformers are part of a Marchand Balun Combiner.

22. The integrated circuit of claim 18, wherein the center tap terminal is a first center tap terminal, the frequency is a first frequency, the resonator circuit is a first resonator circuit, the resonator terminal is a first resonator terminal, the amplifier circuit has a second center tap terminal, and the amplifier circuit includes:
a third transformer including a third primary side conductor and a third secondary side conductor, the third primary side conductor coupled to the first input, and the third secondary side conductor coupled between the output and the second center tap terminal; and
a fourth transformer including a fourth primary side conductor and a fourth secondary side conductor, the fourth primary side conductor coupled to the second input, and the fourth secondary side conductor coupled between the second center tap terminal and the reference terminal; and
the integrated circuit further comprises a second resonator circuit having a second resonator terminal coupled to the second center tap terminal, the second resonator circuit configured to resonate at a second frequency based on the fundamental operating frequency.

23. The system of claim 1, wherein:
the output of the first differential outputs is a first output of the first differential outputs, and the output of the second differential outputs is a first output of the second differential outputs;
the first primary side conductor includes a first coil having first and second ends, the first end coupled to the first output of the first differential outputs, and the second end coupled to a second output of the first differential outputs;
the first secondary side conductor includes a second coil that overlaps with the first coil; and
the second primary side conductor includes a third coil having third and fourth ends, the third end coupled to the first output of the second differential outputs, and the fourth end coupled to a second output of the second differential outputs.

24. The system of claim 1, wherein:
the output of the first differential outputs is a first output of the first differential outputs, and the output of the second differential outputs is a first output of the secondfirst differential outputs;
the first primary side conductor includes a first conductor having first and second ends and a second conductor having third and fourth ends, the first end coupled to the first output of the first differential outputs, and the third end coupled to a second output of the first differential outputs;
the second primary side conductor includes a third conductor having fifth and sixth ends and a fourth conductor having seventh and eighth ends, the fifth end coupled to the first output of the first differential outputs, the seventh end coupled to a second output of the second differential outputs, the sixth end coupled to second end, and the eighth end coupled to the fourth end.

25. The system of claim 1, wherein:

the output of the first differential outputs is a first output of the first differential outputs, and the output of the second differential outputs is a first output of the second differential outputs;

the reference terminal is a first reference terminal;

the first primary side conductor includes a first conductor having first and second ends and a second conductor having third and fourth ends, the first end coupled to the first output of the first differential outputs, the second end coupled to a second reference terminal, the third end coupled to a second output of the first differential outputs, and the fourth end coupled to the second reference terminal;

the second primary side conductor includes a third conductor having fifth and sixth ends and a fourth conductor having seventh and eighth ends, the fifth end coupled to the first output of the first differential outputs, the sixth end coupled to the fourth end, the seventh end coupled to a second output of the second differential outputs, and the eighth end coupled to the second reference terminal.

26. An amplifier circuit, comprising:

a first conductor coupled between a first input and a second input;

a second conductor coupled between a third input and a fourth input;

a third conductor coupled between an output and a reference terminal, the third conductor also coupled to a center tap terminal, the first and second conductors magnetically coupled to the third conductor;

and a resonator circuit having a resonator terminal coupled to the center tap terminal, the resonator circuit configured to resonate at a frequency based on a fundamental operating frequency of amplifier circuit.

27. The amplifier circuit of claim 26, further comprising:

a first differential amplifier having first differential inputs and first differential outputs, the first differential inputs coupled to the first input and a third input; and a second differential amplifier having second differential inputs and second differential outputs, the second differential inputs coupled to the second input and the fourth input.

* * * * *